US007009903B2

(12) United States Patent
Perner et al.

(10) Patent No.: US 7,009,903 B2
(45) Date of Patent: Mar. 7, 2006

(54) SENSE AMPLIFYING MAGNETIC TUNNEL DEVICE

(75) Inventors: Fredrick A. Perner, Santa Barbara, CA (US); Manish Sharma, Sunnyvale, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/855,042

(22) Filed: May 27, 2004

(65) Prior Publication Data

US 2005/0276097 A1 Dec. 15, 2005

(51) Int. Cl.
*G11C 7/02* (2006.01)

(52) U.S. Cl. ....................................... 365/209; 365/158

(58) Field of Classification Search ..................... None
See application file for complete search history.

(56) References Cited

U.S. PATENT DOCUMENTS

| | | | | |
|---|---|---|---|---|
| 5,793,697 | A * | 8/1998 | Scheuerlein | 365/230.07 |
| 5,804,992 | A | 9/1998 | Lee | |
| 5,978,257 | A * | 11/1999 | Zhu et al. | 365/173 |
| 6,181,633 | B1 | 1/2001 | Shimakawa et al. | |
| 6,269,018 | B1 * | 7/2001 | Monsma et al. | 365/145 |
| 6,573,586 | B1 * | 6/2003 | Sakata et al. | 257/529 |
| 6,660,604 | B1 | 12/2003 | Hwang et al. | |
| 6,667,901 | B1 | 12/2003 | Perner et al. | |
| 6,711,053 | B1 * | 3/2004 | Tang | 365/158 |

* cited by examiner

*Primary Examiner*—Son Mai

(57) ABSTRACT

A sense amplifying magnetic tunnel (SAMT) device is disclosed. In a particular embodiment, a field effect transistor (FET) having a drain, a source, a channel therebetween, a gate electrode and a tunneling gate oxide proximate to the channel is provided. In addition, a spin valve memory (SVM) cell is provided electrically coupled to the gate electrode. The electrical coupling between the SVM cell and the gate electrode serves to provide a control potential to the gate. In addition, the coupling provides a gain to a current passed through the SAMT device.

34 Claims, 6 Drawing Sheets

SENSE AMPLIFYING MAGNETIC TUNNEL DEVICE

FIELD OF THE INVENTION

This invention relates generally to magnetic memory devices and in particular to variable resistor devices such as magnetic random access memory arrays (commonly referred to as "MRAM").

BACKGROUND

Today's computer systems are becoming increasingly sophisticated, permitting users to perform an ever increasing variety of computing tasks at faster and faster rates. The size of the memory and the speed at which it can be accessed bear heavily upon the overall speed of the computer system.

Generally, the principle underlying the storage of data in magnetic media (main or mass storage) is the ability to change and/or reverse the relative orientation of the magnetization of a storage data bit (i.e. the logic state of a "0" or a "1"). The coercivity of a material is the level of demagnetizing force that must be applied to a magnetic particle to reduce and/or reverse the magnetization of the particle. Generally speaking, the smaller the magnetic particle, the higher its coercivity.

A prior art magnetic memory cell may be a tunneling magneto-resistance memory cell (TMR), a giant magneto-resistance memory cell (GMR), or a colossal magneto-resistance memory cell (CMR). These types of magnetic memory are commonly referred to as spin valve memory cells (SVM). FIGS. 1 and 2 provide a perspective view of a typical prior art magnetic memory cell.

As shown in prior art FIGS. 1 and 2, a magnetic spin valve memory (SVM) cell 101 generally includes a data layer 103 which may alternatively be called a storage layer or bit layer, a reference layer 105, and an intermediate layer 107 between the data layer 103 and the reference layer 105. The data layer 103, the reference layer 105, and the intermediate layer 107 can be made from one or more layers of material. Electrical current and magnetic fields may be provided to the SVM cell 101 by an electrically conductive row conductor 109 and an electrically conductive column conductor 111. It is understood and appreciated that as used herein, the terms row and column conductor have been selected for ease of discussion. Under appropriate circumstances these labels may be reversed and or otherwise substituted for such titles as word line and bit line.

The data layer 103 is usually a layer of magnetic material that stores a data bit as an orientation of magnetization M1 that may be altered in response to the application of an external magnetic field or fields. More specifically, the orientation of magnetization M1 of the data layer 103 representing the logic state can be rotated (switched) from a first orientation 117, representing a logic state of "0", to a second orientation 119, representing a logic state of "1", and/or vice versa.

The reference layer 105 is usually a layer of magnetic material in which an orientation of magnetization M2 is "pinned", as in fixed, in a predetermined direction, or pinned orientation 121. The direction is predetermined and established by conventional microelectronic processing steps employed in the fabrication of the magnetic memory cell 101.

Typically, the logic state (a "0" or a "1") of a magnetic memory cell depends on the relative orientations of magnetization M1 in the data layer 103 and M2 of the reference layer 105—first orientation 117 to pinned orientation 121, as shown in FIG. 1, or second orientation 119 to pinned orientation 121, as shown in FIG. 2. For example, when an electrical potential bias is applied across the data layer 103 and the reference layer 105 in the SVM cell 101, electrons migrate between the data layer 103 and the reference layer 105 through the intermediate layer 107. The intermediate layer 107 is typically a thin dielectric layer, which is commonly referred to as a tunnel barrier layer. The phenomenon that causes the migration of electrons through the barrier layer may be referred to as quantum mechanical tunneling or spin tunneling.

The logic state may be determined by measuring the resistance of the SVM cell 101. For example, if the second orientation 119 of the magnetization M1 in the data layer 103 is parallel to the pinned orientation 121 of magnetization in the reference layer 105, the SVM cell 101 will be in a state of low resistance, R, see FIG. 2.

If the first orientation 117 of the magnetization M1 in the data layer 103 is anti-parallel (opposite) to the pinned orientation 121 of magnetization in the reference layer 105, the SVM cell 101 will be in a state of high resistance, R+ΔR, see FIG. 1. The orientation of M1 and, therefore, the logic state of the SVM cell 101, may be read by sensing the resistance of the SVM cell 101.

The resistance may be sensed by applying a voltage to a selected SVM cell 101 and measuring a sense current that flows through the SVM cell 101. Ideally, the resistance is proportional to the sense current.

The single SVM cell 101 shown in FIGS. 1 and 2 is typically combined with other substantially identical SVM cells. In a typical MRAM device, the SVM cells are arranged in a cross-point array. Parallel conductive columns (e.g., column 1, 2, 3 . . . ), also referred to as word lines, cross parallel conductive rows (e.g., row A, B, C . . . ), also referred to as bit lines. The traditional principles of column and row arrays dictate that any given row will only cross any given column once.

An SVM cell is placed at each intersecting cross-point between a row and a column. By selecting a particular row (B) and a particular column (3), any one memory cell positioned at their intersection (B,3) can be isolated from any other memory cell in the array. Such individual indexing is not without complexities.

A typical MRAM cross-point array may easily consist of 1,000 rows and 1,000 columns uniquely addressing 1,000,000 SVM cells. Sensing the resistance state of a given SVM cell in the cross-point array can be unreliable. The cross-point array may be characterized as a resistive cross-point device. All of the resistive elements (the SVM cells) within the array are coupled together through the parallel sets of row and column conductors. The resistance between a selected row and a selected column equals the resistance of the element at that cross point (R) in parallel with a combination of resistances of the unselected resistive elements (2R/1000+R/1000000).

Unselected resistive elements are also prone to permitting the development of sneak path current, ΔV*1000/R. Where R is on the order of 1 mega-ohm and ΔV is 50 milli-volts, there will be 50 pico-amps per sneak path, or 50 nano-amps where there are 1,000 rows. Expanding the cross-point array to 10,000×10,000 the combined sneak path current may total 500 nano-amps.

The efficiency of a sense amplifier detecting changes in sense currents on the order of 20 to 50 nano-amps when the selected memory element is changed from R to R+ΔR is reduced in the presence of large sneak path currents. Sense amplifiers can be made to operate when the ratio of sense current to sneak path current is as undesirable as 1 over 10 (1/10). If the sneak path current is increased as in the example, from 50 nano-amps to 500 nano-amps when sensing a signal current of 20 nano-amps, the reliability of the sense amplifier will be reduced.

Understanding the propensity for sneak current to occur in the memory array, design parameters should be accordingly accommodating. The effective size of a typical resistive memory cross-point array is therefore limited to about 1,000×1,000, since a larger array may permit a combined sneak path current that overshadows the detection of a change within a single given memory cell. More simply stated, as the size of the array increases, the ability to measure and detect the change of resistance within a single cell generally decreases.

Adding switches such as series select transistors to each resistive element to aid in their isolation has proven costly in the past, both in terms of space within the array and the complexity of manufacturing. In addition, a series select transistor is a three terminal device while a resistive element such as an SVM cell is a two terminal device.

Hence, there is a need for an ultra-high density resistor device, such as a magnetic memory device, which overcomes one or more of the drawbacks identified above.

SUMMARY

The present disclosure advances the art and overcomes problems articulated above by providing a sense amplifying magnetic tunnel device.

In particular, and by way of example only, according to an embodiment of the present invention, this invention provides a sense amplifying magnetic tunnel (SAMT) device including: a field effect transistor (FET) having a drain, a source, a channel therebetween, a gate electrode and a tunneling gate oxide proximate to the channel; and a spin valve memory (SVM) cell electrically coupled to the gate electrode.

In yet another embodiment, the invention may provide a sense amplifying magnetic tunnel (SAMT) device including: at least one field effect transistor (FET) having a drain, a source, a channel therebetween, a gate electrode and a tunneling gate oxide proximate to the channel; at least one spin valve memory (SVM) cell having a variable resistance, electrically coupled in series to the gate electrode of an FET, the SVM cell having: a first ferromagnetic layer; an intermediate layer in contact with the first layer; a second ferromagnetic layer in contact with the intermediate layer opposite from the first ferromagnetic layer; wherein a current flow through the SVM cell provides a leakage current into the channel through the tunneling gate oxide, the leakage current producing a gain when a voltage potential is applied to the SVM cell and the drain.

DETAILED DESCRIPTION

Before proceeding with the detailed description, it is to be appreciated that the present teaching is by way of example, not limitation. The concepts described herein are not limited to use or application with a specific type of magnetic memory. Thus, although the instrumentalities described herein are for the convenience of explanation, shown and described with respect to exemplary embodiments, it will be appreciated that the principals herein may be equally applied to other types of magnetic memory.

Figure 1:
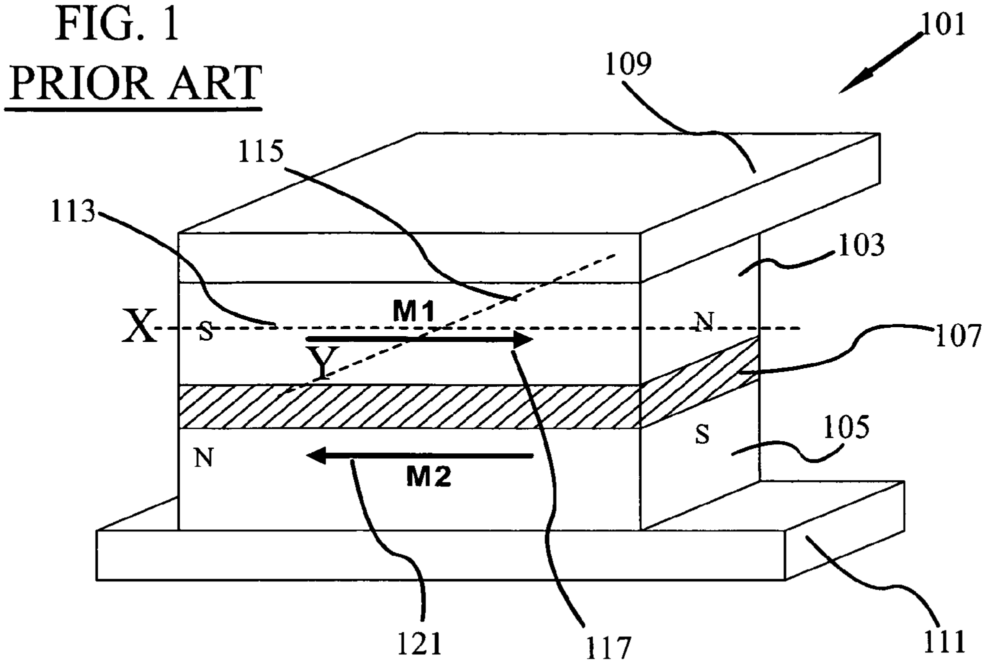
FIG. 1 provides a perspective views of a prior art magnetic memory cell with a first magnetic orientation.
Figure 2:
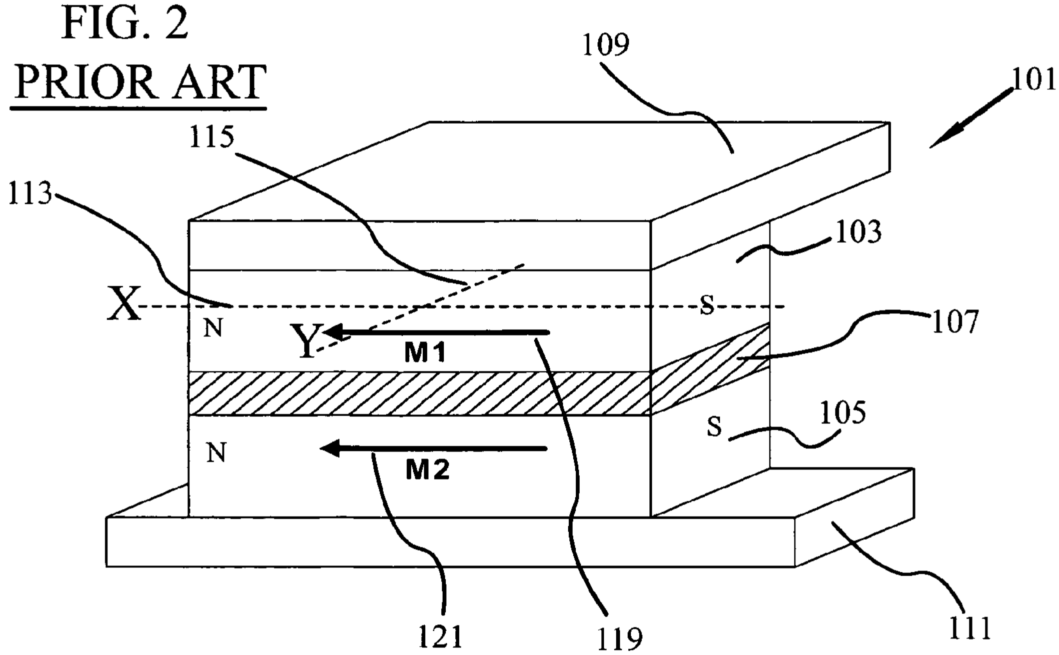
FIG. 2 provides a perspective view of a prior art magnetic memory cell with a second magnetic orientation.
Figure 3:
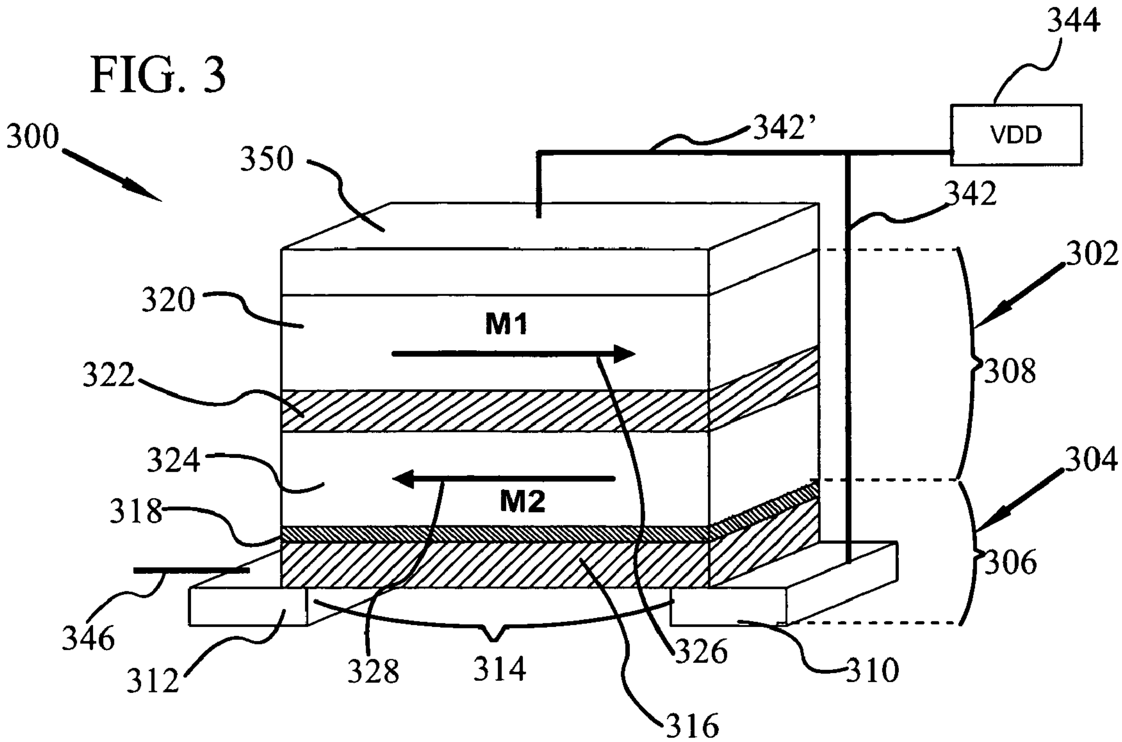
FIG. 3 is a partial perspective view of the sense amplifying magnetic tunnel (SAMT) device according to one embodiment.

Referring now to the drawings, and more particularly to FIG. 3, there is shown a portion of a sense amplifying magnetic tunnel (SAMT) device 300, having an adjustable resistor device 302 paired with and electrically coupled to an isolator device 304. The electric coupling serving to provide a gain to a current passed through the paired adjustable resistor device 302 and isolator device 304.

In at least one embodiment, the isolator device 304 is a field effect transistor (FET) 306, and the adjustable resistor device 302 is a spin valve magnetic memory (SVM) cell 308. The FET 306 has a drain 310, a source 312, a channel 314 between the drain 310 and the source 312, and a tunneling gate oxide 316 proximate to the channel 314. A metal gate electrode 318, commonly referred to as "gate," is disposed on top of the tunneling gate oxide 316.

The SVM cell 308 is electrically coupled to the gate electrode 318. In at least one embodiment, the SVM cell 308 is physically placed in contact with the gate electrode 318. In at least one embodiment, the SVM cell 308 is coupled in series to the gate electrode 318 of the FET 306.

The drain 310 is more positive than the source 312; however, current generally will not flow from the drain 310 to the source 312 unless or until the gate electrode 318 is brought positive with respect to the source 312. In other words, by applying a potential to the gate electrode 318, the conductive properties of the channel 314 are changed. In a traditional FET, the gate is isolated from the channel by an electrical isolation oxide, such that no actual current passes between the gate and the channel when a DC voltage is applied to the gate.

Distinguished from a traditional FET, in the SAMT device 300, the employed FET 306 is fabricated to have the tunneling gate oxide 316. More specifically the gate electrode 318 is not fully isolated from the channel 314 by the tunneling gate oxide 316. As the tunneling gate oxide 316 is not a complete isolator, a certain amount of current will flow from the gate electrode 318 through the tunneling gate oxide 316 into the channel 314. This current flow through the tunneling gate oxide 316 may be termed a leakage current, as it is leaking into the channel 314.

Figure 4:
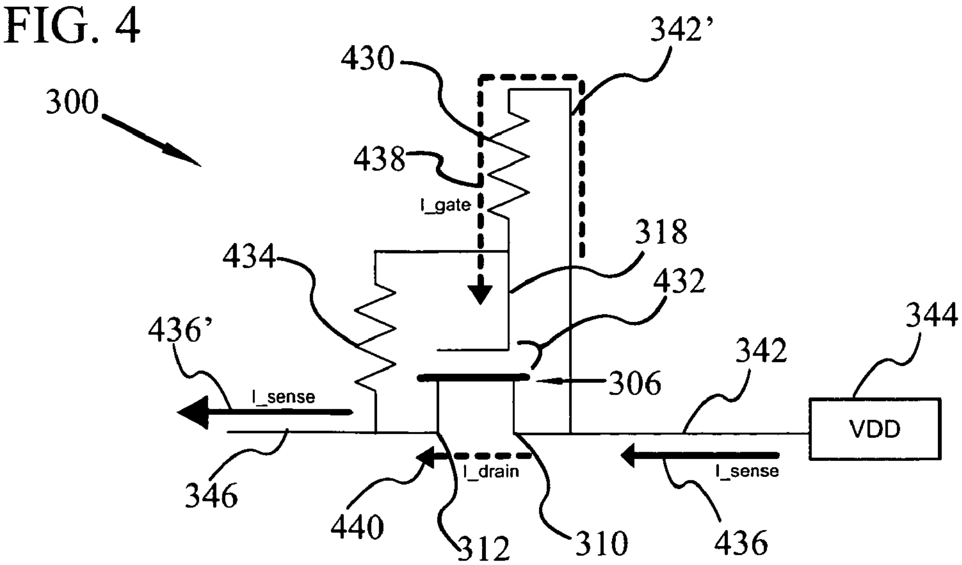
FIG. 4 is a conceptual electrical representation of the SAMT shown in FIG. 3.

FIG. 4 conceptually illustrates an electrical diagram of at least one embodiment of the SAMT device 300. The SVM cell 308 is represented as a resistor 430 coupled to a gate electrode 318. The tunneling gate oxide 316 as shown in FIG. 3 is represented by the gap 432 in FIG. 4. The tunneling property of tunneling gate oxide 316 is represented as a resistor 434 in FIG. 4.

By electrically coupling the SVM cell 308 to the gate electrode 318, a current, such as a sense current (I_sense) 436 provided by power source 344 effectively splits to flow through the SVM cell 308 via conductor 342' as SVM current (I_gate) 438, and to flow through the channel 314 as channel current (I_drain) 440 when the gate electrode 318 is brought positive by an applied potential. The I_gate 438 flowing through the SVM cell 308, provides an injected current into the channel 314 through the tunneling gate oxide 316, 432. In addition, a current, such as I_gate 438, flowing through the SVM cell 308 develops a control potential for gate electrode 318. The resulting output of I_sense 436' realized at a conductor 346 is substantially greater than I_gate 438.

As SVM cell 308 or representative resistor 430 has a variable resistance, the flow of I_gate 438 through SVM cell 308 or representative resistor 430 and the potential provided to the gate electrode 318 and tunneling through the tunneling gate oxide 316, 432 is variable as well. The tunneling current I_gate 438 is achieved when a voltage potential is applied to the SVM cell 308 or representative resistor 430 by power supply 344.

As may be more fully appreciated with respect to FIG. 4, as power supply 344 provides a voltage potential, a current, such as I_sense 436, is provided to both the FET 306 and SVM cell 308, shown as resistor 430, by power conductor 342 connecting to the drain 310 and power conductor 342' connecting to the SVM cell 308, represented as resistor 430. Resistor 430 is electrically coupled to the gate electrode 318, thereby providing a control potential to the gate electrode 318.

The current passing through the tunneling gate oxide 432 is represented by current flow through resistor 434 that is disposed between resistor 430 and power conductor 346. Power conductor 346, coupled to the source 312, provides the output I_sense 436' of the FET 306 combined with the injected current provided by the resistor 430, through tunneling gate oxide 432, to the sample circuit (sense amplifier) and/or control logic of the system (see FIG. 5). Moreover, power supply 344 provides I_sense 436, from a voltage potential otherwise described as a sense potential. In at least one embodiment, the SVM cell 308 is coupled between a sense potential (power supply 344) and the tunneling gate oxide 316, 432.

If the FET 306 were not present the drain current would be zero. The sense current would amount to simply the current passing through the SVM cell 308, represented as resistor 430, and as in a traditional SVM cell, the sense current would be quite small. For example, and as discussed further below, for a typical SVM cell such as SVM cell 308 the resistance through the cell is typically about 1 mega-ohm. If a 0.5V voltage is applied an SVM cell 308 with a 1 mega-ohm resistance the result is a 0.5 micro-amp current.

As is further described below, it is the resistance within the SVM cell 308 which represents a "0" or a "1". The change of resistance within the SVM cell 308 representing a "0" or a "1" is typically on the order of 10%. As a result the signal from the SVM cell 308 that indicates the stored bit is 0.05 micro-amps. Detecting such a low value in a memory device employing hundreds to thousands of SVM cells can be challenging, a condition advantageously overcome by the SAMT device 300.

More specifically, as the SVM cell 308 is electrically coupled to the gate electrode 318, the current passing through the SVM cell 308 is the tunneling current through the gate electrode 318. As is known and understood in the art, applying a relatively small voltage to the gate electrode 318 will permit a drain current to flow through the FET 306 when the voltage applied to the gate electrode 318 is at or above a pre-determined threshold. The gate voltage is developed from the voltage divider effect of the supply voltage applied to the series combination of the SVM cell 308 and the gate tunneling oxide 316.

The additional component of the drain current provides a gain in I_sense as received in conductor 346, resulting in a higher I_sense than would occur with a traditional, fully isolated gate in a traditional FET. This resulting gain coupled with the storage abilities of the SVM cell 308 permits the SAMT device 300 to be a sense amplifying data storage device. This resulting gain is further discussed with reference to FIGS. 7 and 8 below following a further description of the physical SAMT device 300 and the operational characteristics of the SVM cell 308.

It is noted that a traditional FET operates as a three terminal device. As shown in FIGS. 3 and 4, in at least one embodiment, a first electrical conductor (power conductor 342') is coupled to the gate terminal (i.e. the gate electrode 318) of the FET 306 through the SVM cell 308, a second electrical conductor (power conductor 346) is coupled to the source 312 and a third power conductor (power conductor 342) is coupled to the drain 310. As the first electrical conductor (power conductor 342') and the third electrical conductor (power conductor 342) are electrically coupled, there is effectively one electrical conductor (power conductor 342) leading to SAMT device 300 and one electrical conductor (power conductor 346) leading from SAMT device 300. Coupling the SVM cell 308 to gate electrode 318 provides an overall device that advantageously operates as a two terminal device.

Figure 5:
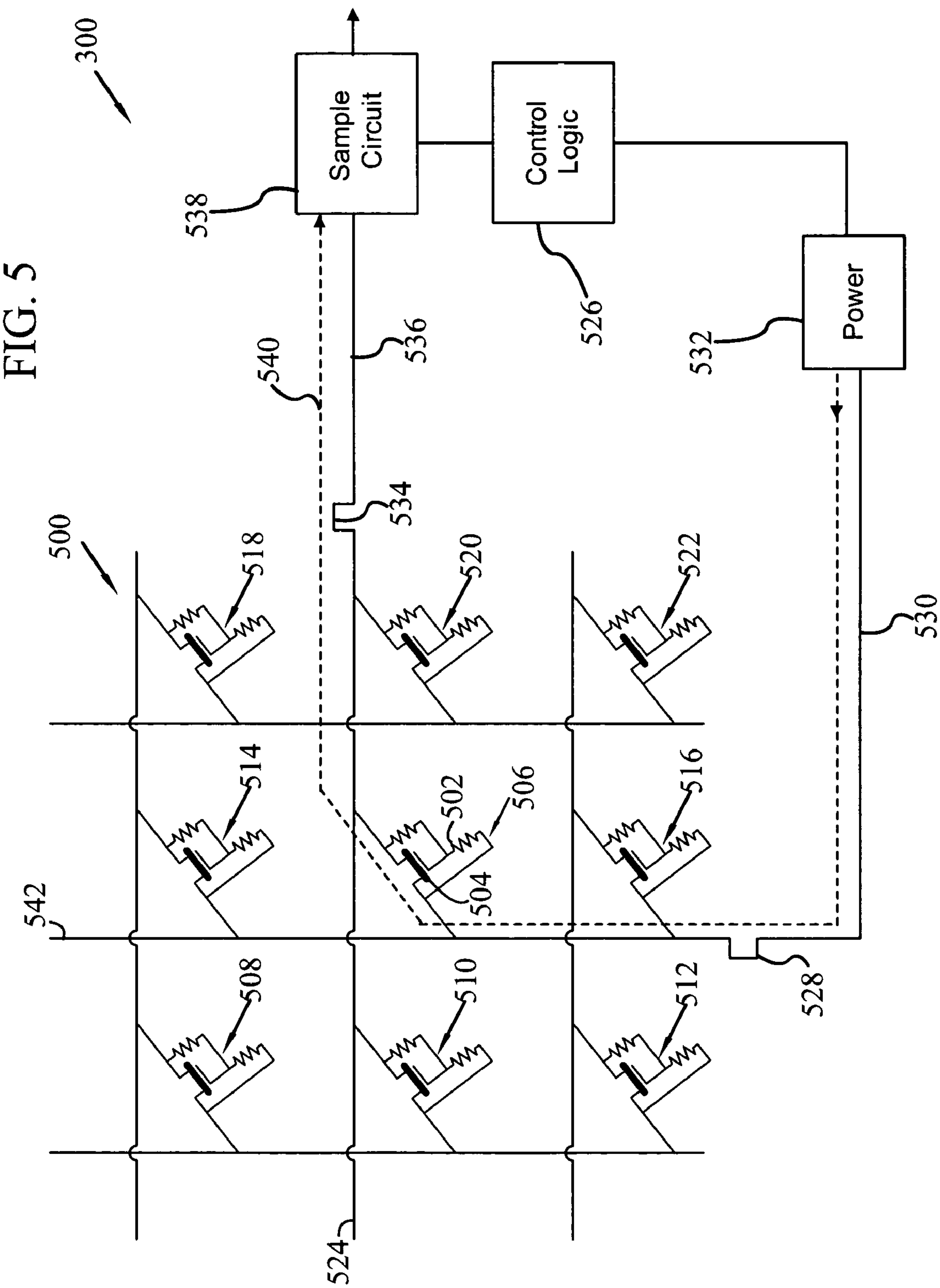
FIG. 5 is a conceptual cross-point array according to another embodiment.

FIG. 5 conceptually illustrates a cross-point array 500 of SAMT device 300. A selected SAMT device 300 is represented as an adjustable resistor 502 paired with and electrically coupled to an isolator device 504, together identified as SAMT device 506. Selected SAMT device 506 is disposed between selected conductive column 542 and selected conductive row 524. Unselected SAMT devices are represented as SAMT devices 508~522.

In at least one embodiment, for each SAMT device 506~520, the isolator device 504 is an FET having a tunneling gate oxide and the adjustable resistor is an SVM cell electrically coupled to the gate electrode disposed upon the tunneling gate oxide, as herein described. Moreover, in at least one embodiment, the SAMT device as a whole is a cross-point memory device.

Selected SAMT device 506 is selected by appropriate control logic 526 directing the amplification of application of a voltage potential V1 to conductive column 542. This connection is facilitated by a switching element 528. An operating potential is applied to SAMT device 506 by power conductor 530 that connects a power source 532 to switching element 528, selecting conductive column 542.

To detect the gain from I_sense as it runs through selected SAMT device 506, switching element 534 connects power conductor 536 to selected conductive row 524 and sample circuit 538, such as a self-reference double or triple sense amplifier circuit providing a digital output representing the state of the selected SAMT device 506. The power path through the selected SAMT device 506 is illustrated as dotted line 540. In at least one embodiment, this measurement of current flow is made according to an integration time.

The advantageous two terminal operation of the selected SAMT device 506 may more fully appreciated with respect to FIG. 5. The selected SAMT device 506 is selected and controlled through the electrical connection of a selected conductive row 524 and a selected conductive column 542.

The adjustable resistive quality of SVM cell 308 results from its structure. As shown in FIG. 3, the SVM cell 308 has a first ferromagnetic layer 320, an intermediate layer 322 and a second ferromagnetic layer 324. In at least one embodiment, the first ferromagnetic layer 320 is a ferromagnetic data layer and the second ferromagnetic layer 324 is a reference layer. In an alternative embodiment, the first ferromagnetic layer 320 is a reference layer and the second ferromagnetic layer 324 is a ferromagnetic data layer. Under appropriate circumstances the SVM cell 308 may have an electrically conductive cap 350 in electrical contact with the first ferromagnetic layer 320. In at least one embodiment, this cap 350 may be an incorporated part of the power conductor 342'.

For the sake of ease in discussion and conceptual simplicity, the first layer 320 will be further discussed as a data layer 320 and the second layer will be further discussed as a reference layer 324. A ferromagnetic data layer permits the storing of a bit of data as an alterable orientation of magnetization M1 326. A reference layer is used to determine the orientation status of the data layer.

In at least one embodiment, the reference layer 324 is characterized by a non-pinned orientation of magnetization M2 328 and a lower coercivity than the data layer 320. In at least one alternative embodiment, the reference layer 324 is characterized by a pinned orientation of magnetization M2 328.

The intermediate layer 322 has opposing sides such that the data layer 320 in contact with one side is in direct alignment with, and substantially uniformly spaced from, the reference layer 324, in contact with the second side of the intermediate layer 322.

The logic state (a "0" or a "1") of SVM cell 308 depends on the relative orientations of magnetization M1 326 in the data layer 320 and M2 328 of the reference layer 324. The logic state may be determined by measuring the resistance of the SVM cell 308. For example, if the orientation of the magnetization M1 326 in the data layer 320 is parallel to the orientation of magnetization M2 328 in the reference layer 324, the SVM cell will be in a state of low resistance, R.

If the orientation of magnetization M1 326 in the data layer 320 is anti-parallel (opposite) to the orientation of magnetization M2 328 in the reference layer 324, the SVM cell 308 will be in a state of high resistance, R+AR. The orientation of M1 and, therefore, the logic state of the SVM cell 308 may be read by sensing the resistance of the SVM cell 308.

Typically, the resistance may be sensed by applying a voltage to a selected SVM cell 308 and measuring a sense current I_gate 438 (shown in FIG. 4) that flows through the SVM cell 308. As taught herein, the SAMT device 300 amplifies the sense current so that the resistance detected is indicated by the value of I_sense 436. Ideally, the resistance is proportional to the sense current (e.g., R=V/I). It is understood and appreciated that a convention will be adopted such as, for example, a logic state of "1" exists where M1 and M2 are anti-parallel (high resistance) in a first state, and a logic state of "0" exists where M1 and M2 are parallel (low resistance) in a second state.

The data layer 320 is typically established with the use of a ferromagnetic (FM) material layer. The FM layer is generally not provided in contact with an anti-ferromagnetic (AFM) layer, as it is generally not necessary to establish a magnetic exchange bias. The hysteresis loop of the data layer 320 is substantially symmetric, indicating two substantially equivalent easy directions for magnetic alignment.

With respect to a traditional bar magnet, there are two equally stable easy spin directions (each rotated 180 degrees) along the easy axis, generally the longer axis of the magnet—the shorter axis being the hard axis. Alignment in either direction requires the same energy and requires the same external field to align the spin of the atomic particles and thus the magnetic field, in either direction.

The magnetic orientation M1 326 of the data layer 320 can be oriented in a chosen direction along generally the easy axis when an appropriate magnetic field is applied, and remain in that orientation when the field is removed. More specifically the orientation M1 326 is set by applying a magnetic field that overcomes the coercivity of the data layer 320, Hc(data). In short, the magnetic orientation M1 326 of the data layer 320 is alterable, but will be maintained in the last state of orientation. With respect to the above description of the gain in I_sense, this resulting gain, coupled with the ability of the SVM cell 308 to respond to magnetic fields, permits the SAMT device 300 to be a sense amplifying magnetic field sensor.

As noted above, in at least one embodiment the reference layer 324 is a pinned reference layer 324. Establishing a pinned reference layer 324 is typically achieved with the use of an anti-ferromagnetic (AFM) material in direct physical contact with a ferromagnetic (FM) material. AFM materials magnetically order below their Neel temperatures ($T_N$), the temperatures at which they become anti-ferromagnetic or anti-ferrimagnetic. The Neel temperature of AFM materials is analogous to the Curie Temperature ($T_C$) of FM materials, the temperature above which an FM loses its ability to possess an ordered magnetic state in the absence of an external magnetic field. Generally, $T_C$ of the FM is greater than $T_N$ of the AFM.

In establishing a reliable pinned field, it is desirable to establish a preferred orientation along one direction of an axis, typically the easy axis although under appropriate circumstances it may be the hard axis. By growing the FM on an AFM in a magnetic field H or annealing in field H at a temperature above the Neel temperature of the AFM, the hysteresis loop (FM+AFM+H) becomes asymmetric and is shifted. In general, this shift is significantly greater than H, on the order of a couple hundred Oe (Oe=oersted, the centimeter-gram-second electromagnetic unit of magnetic intensity). This unidirectional shift is called the exchange bias and demonstrates that there is now a preferred easy axis alignment direction.

As noted above, in at least one embodiment the reference layer 324 is a soft-reference layer 324. In contrast to a pinned reference layer, a soft-reference layer is established by providing an FM layer that is not in direct contact with an AFM layer. The coercivity of the soft-reference layer 324, Hc(sref), is substantially minimal. Moreover, in the presence of a magnetic field with a magnitude greater than Hc(ref), the coercivity of the soft-reference layer 324 will be overcome and the orientation M2 328 of the soft-reference layer 324 will align to the field. The soft-reference layer 324 is therefore similar to the data layer 320 in having the ability to orient in the presence of a magnetic field.

The ferromagnetic data layer 320 and the reference layer 324 (soft or pinned) may be made from a material that includes, for example: Nickel Iron (NiFe), Nickel Iron Cobalt (NiFeCo), Cobalt Iron (CoFe), and alloys of such metals. In at least one embodiment, the data layer 320 and reference layer 324 are made from NiFe. One difference between the data layer 320 and the reference layer 324 is that the coercivity of the reference layer 324, Hc(serf) is less than the coercivity of the data layer 320, Hc(data). As such, the orientation M2 328 of the reference layer 324 may be oriented/re-oriented without disrupting the orientation M1 326 of the data layer 320. The difference in coercivity may be achieved by both shape and/or thickness of the data layer 320 and reference layer 324.

In addition, both the reference layer 324 and the data layer 320 may be formed from multiple layers of materials. Such formation from multiple layers may be desired, for example, to provide a more uniform magnetic structure than may be achieved by applying either a very thick or very thin layer of FM material. However, for conceptual simplicity and ease of discussion, each layer component is herein discussed as a single layer.

The type of intermediate layer 322 is dependent upon the type of SVM cell employed. The behavior and properties of SVM memory cells are generally well understood. Three types are types of SVM cells in particular are known—a tunneling magneto-resistance memory cell (TMR), a giant magneto-resistance memory cell (GMR) and colossal magneto-resistance memory cell (CMR). GMR and CMR memory cells have similar magnetic behavior but their magneto-resistance arises from different physical effects, as the electrical conduction mechanisms are different. More specifically, in a TMR-based memory cell, the phenomenon is referred to as quantum-mechanical tunneling or spin-dependent tunneling. In a TMR memory cell, the intermediate layer 322 is a thin barrier of dielectric material through which electrons quantum mechanically tunnel between the data layer 320 and the reference layer 324.

In a GMR memory cell, the intermediate layer 322 is a thin spacer layer of non-magnetic but conducting material. Here, the conduction is a spin-dependent scattering of electrons passing between the data layer 320 and the reference layer 324 though the intermediate layer 322. In either case, the resistance between the data layer 320 and the reference layer 324 will increase or decrease depending on the relative orientations of the magnetic fields M1 326 and M2 328. It is that difference in resistance that is sensed to determine if the data layer 320 is storing a logic state of “0” or a logic state of “1”.

In at least one embodiment, the SVM cell 308 is a TMR cell wherein the intermediate layer 322 is a tunnel junction layer made from an electrically insulating material (a dielectric) that separates and electrically isolates the data layer 320 from the reference layer 324. Suitable dielectric materials for the dielectric intermediate layer 322 may include, but are not limited to: Silicon Oxide ($SiO_2$), Magnesium Oxide (MgO), Silicon Nitride ($SiN_x$), Aluminum Oxide ($Al_2O_3$), Aluminum Nitride ($AlN_x$), and Tantalum Oxide ($TaO_x$). In at least one embodiment, the intermediate layer 322 is Silicon Oxide.

In at least one other embodiment, the SVM cell 308 is a GMR or CMR cell wherein the intermediate layer 322 is made from a non-magnetic material such as a 3d, a 4d, or a 5d transition metal listed in the periodic table of the elements. Suitable non-magnetic materials for a non-magnetic intermediate layer 322 may include, but are not limited to: Copper (Cu), Gold (Au) and Silver (Ag). In at least one embodiment, the intermediate layer 322 is Copper.

While the actual thickness of the intermediate layer 322 is dependent upon the materials selected to create the intermediate layer 322 and the type of tunnel memory cell desired, in general, the intermediate layer 322 has a thickness of about 0.5 nm to about 5.0 nm. However, under appropriate circumstances this thickness may be increased or decreased.

The advantageous tunneling property of the tunneling gate oxide 316 is achieved with the use of a thin barrier of dielectric material, such as (preferably) a tunneling oxide, through which electrons quantum mechanically tunnel. Whereas in a traditional FET the gate electrode 318 insulator may often be an oxide thickness of 50 nanometers or more to prevent a tunneling current, the tunneling gate oxide 316 of the FET 306 is specifically thin enough to permit a tunneling current.

In at least one embodiment, the tunneling gate oxide 316 is a tunnel layer made from an electrically insulating material (a dielectric) that separates and substantially, but not entirely, electrically isolates the bottom of the SVM cell 308, and more specifically the gate electrode 318 from the channel 314. Suitable dielectric materials for the dielectric intermediate layer 322 may include, but are not limited to: Silicon Oxide ($SiO_2$), Magnesium Oxide (MgO), Silicon Nitride ($SiN_x$), Aluminum Oxide ($Al_2O_3$), Aluminum Nitride ($AlN_x$), and Tantalum Oxide ($TaO_x$).

That the materials comprising the tunneling gate oxide 316 may parallel the materials of the intermediate layer 322 in an SVM cell 308 of the TMR form is not accidental. In at least one embodiment, the intermediate layer 322 and the tunneling gate oxide 316 are comprised of substantially the same material. Moreover, in at least one embodiment, the tunnel junction properties of the tunneling gate oxide 316 are substantially similar to the tunnel junction properties of the intermediate layer 322. The gate electrode 318 may be either metal or a silicon material doped for connectivity.

Figure 6:
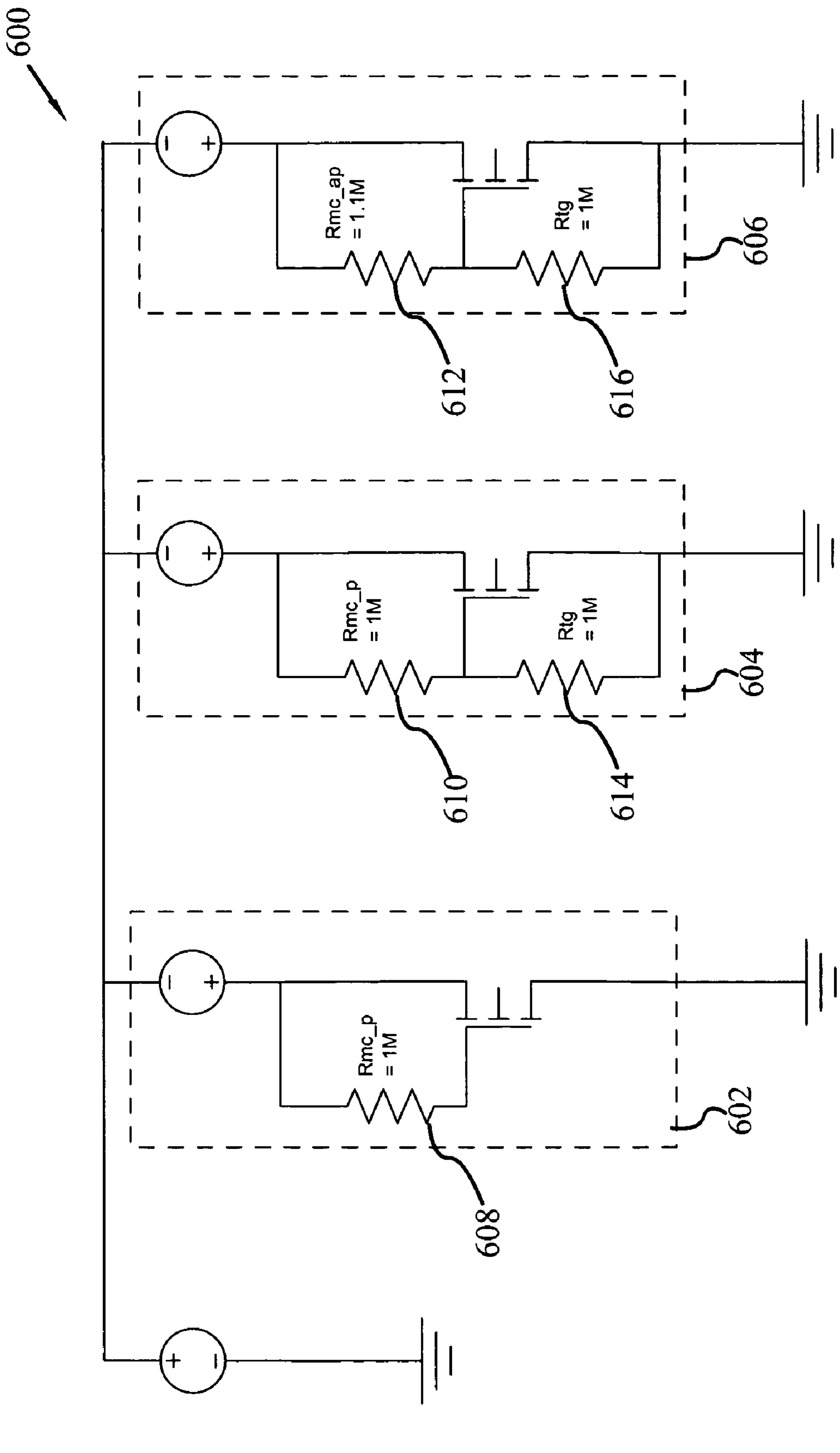
FIG. 6 is a conceptual test circuit for illustrating advantages of the SAMT device.
Figure 7:
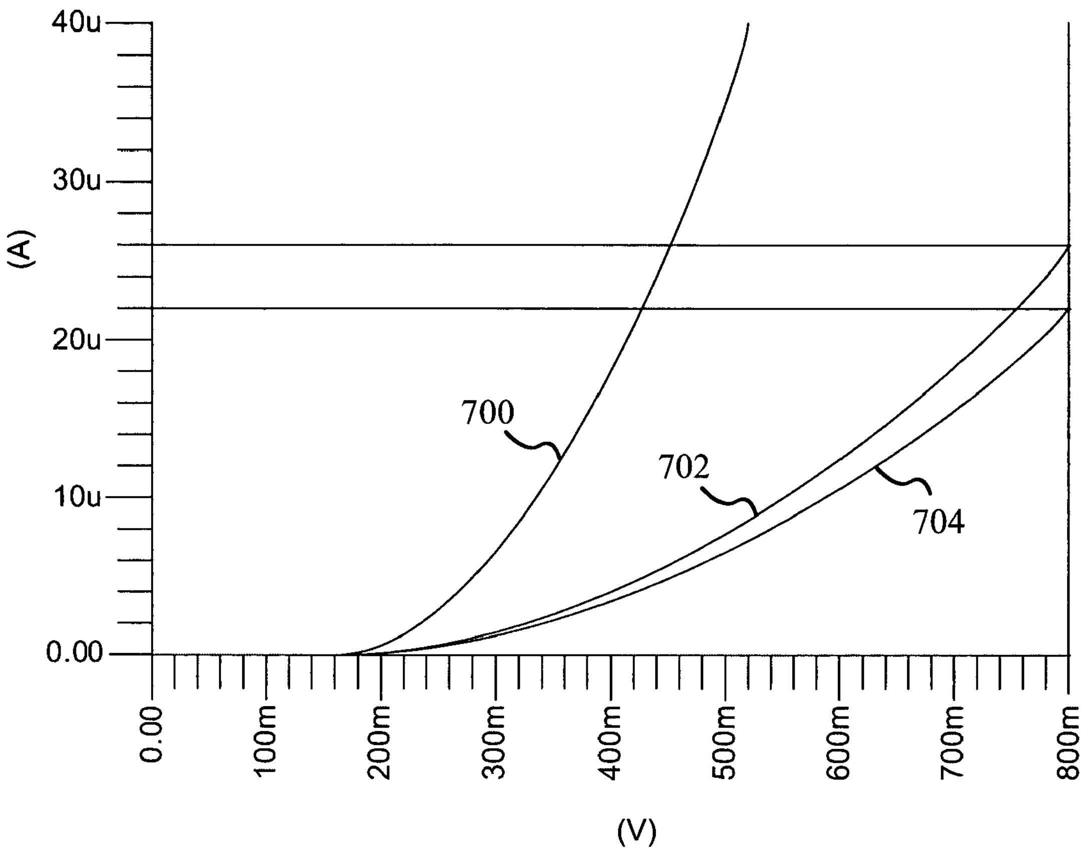
FIG. 7 is graph of the gain in a current passing through test circuit of FIG. 4 in a first test setting.
Figure 8:
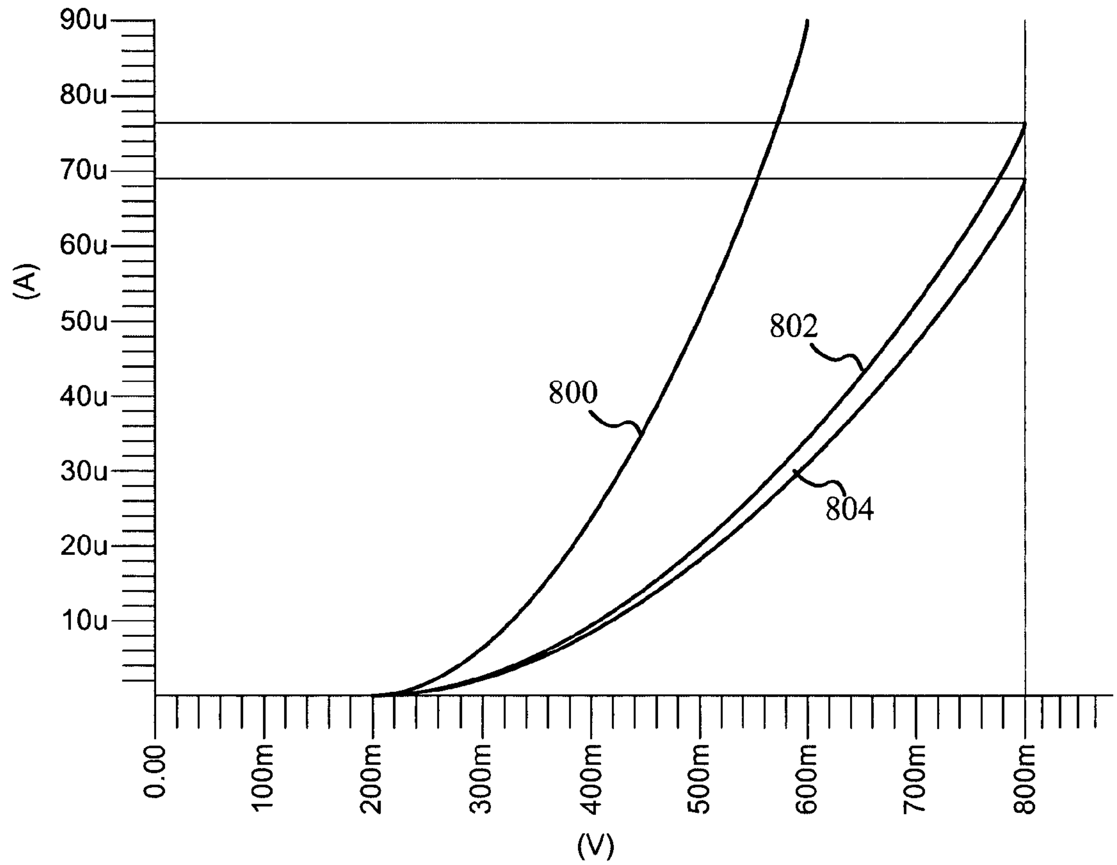
FIG. 8 is graph of the gain in a current passing through test circuit of FIG. 4 in a second test setting.

The graphs provided in FIG. 7 and FIG. 8 illustrate the advantageous gain realized in I_sense for a selected SAMT device 300 due to components of I_gate and I_drain as first introduced above with respect to FIG. 4. FIG. 6 conceptually illustrates a test circuit 600 with three distinct circuit portions—circuit portion 602 for an SVM cell coupled to an FET without a tunneling gate oxide, circuit portion 604 for an SVM cell in a parallel state coupled to an FET with a tunneling gate oxide, and circuit portion 606 for an SVM cell in an anti-parallel state coupled to an FET with a tunneling gate oxide.

Each SVM cell is represented as a resistor. Resistors 608 and 610 represent an SVM cell in a magnetic parallel state (Rmc_p) with a resistance of 1 mega-ohm. Resistor 612 represents an SVM cell in an magnetic anti-parallel state (Rmc_ap) with a resistance of 1.1 mega-ohm. Specifically, the difference in resistance (parallel vs anti-parallel) representing the stored bit is 0.1 mega-ohm.

As circuit portion 602 does not involve a tunneling gate oxide, there is no second resistor shown. For circuit portions 604 and 606, the tunneling resistance of the tunneling gate oxide is represented as resistors 614 and 616 respectively, with a resistance (Rtg) of 1 mega-ohm.

With a single tunneling junction, specifically only the SVM cell of circuit portion 602, the operating voltage potential is typically between 200 and 500 milli-volts. With two tunneling junctions, for example the SVM cell of circuit portions 604 and 606, the operating voltage potential may be doubled. The graphs in FIGS. 7 and 8 represent readings taken for circuit portions 604 and 606 at 800 milli-volts.

FIG. 7 represents a first test case with the initial resistance settings indicated in FIG. 6, specifically Rtg=1 mega-ohm, Rmc_p=1 mega-ohm, and Rmc_ap=1.1 mega-ohms. Line 700 represents the value of I_sense for circuit portion 602. The value of I_sense with a 800 mill-volt sense voltage as indicated by line 702 for circuit portion 604 is substantially about 26.5 micro-amps. The value of I_sense as indicated by line 704 for circuit portion 606 is substantially about 21.3 micro-amps. The resulting ΔI is therefore 5.2 micro-amps.

With 800 milli-volts the voltage across the SVM cell is about half, or 400 milli-volts, providing a base or static current of 0.4 micro-amps. Changing the resistance of the SVM cell from 1 to 1.1 mega-ohm provides a current drop from 0.4 to 0.36 micro-amps. It is this 0.04 micro-amp signal that represents the binary bit of a "0" or a "1" as stored within the SVM cell. This 0.04 micro-amp signal is a component of the gate electrode control current. At 800 milli-volts the resulting difference between graphs 702 and 704 is 5.2 micro-amps, a value advantageously 130 times greater than the 0.04 micro-amp signal from the SVM cell alone.

FIG. 8 represents a first test case with the an increased resistance in the tunneling gate oxide, specifically Rtg=2 mega-ohm, Rmc_p=1 mega-ohm, and Rmc_ap=1.1 mega-ohm. Line 800 represents the value of I_sense for circuit portion 602. The value of I_sense with a 800 mill-volt sense voltage as indicated by line 802 for circuit portion 604 is substantially about 76.2 micro-amps. The value of I_sense as indicated by line 804 for circuit portion 606 is substantially about 68.9 micro-amps. The resulting ΔI is therefore 7.3 micro-amps.

Again, with 800 milli-volts the voltage across the SVM cell is about half, or 400 milli-volts, providing a base or static current of 0.4 micro-amps. Changing the resistance of the SVM cell from 1 to 1.1 mega-ohm provides a current drop from 0.4 to 0.36 micro-amps. At 800 milli-volts the resulting difference between graphs 802 and 804 is 7.3 micro-amps, a value advantageously 184 times greater than the 0.04 micro-amp signal from the SVM cell alone.

As the SAMT device 300 provides an advantageous gain to the I_sense current, the speed and precision of detecting the state of a selected SAMT device is improved. Such gain further permits the fabrication of cross-point memory devices to a scale larger than permitted with non-self amplifying memory cells.

Another embodiment may be appreciated to be a computer with a main board, CPU and at least one memory store comprised of an embodiment of the SAMT device 300, as described herein. Such a computer system raises the advantages of the SAMT device 300 to a system level.

Changes may be made in the above systems and structures without departing from the scope thereof. It should thus be noted that the matter contained in the above description or shown in the accompanying drawings should be interpreted as illustrative and not in a limiting sense. The following claims are intended to cover all generic and specific features described herein, as well as all statements of the scope of the present system and structure, which, as a matter of language, might be said to fall therebetween.

We claim:

1. A sense amplifying magnetic tunnel (SAMT) device comprising:

a field effect transistor (FET) having a drain, a source, a channel therebetween, a gate electrode, and a tunneling gate oxide proximate to the channel; and a spin valve memory (SVM) cell electrically coupled to the gate electrode.

2. The sense amplifying magnetic tunnel device of claim 1, wherein the SAMT device is operable such that a current flow through the SVM cell provides an injected current into the channel through the tunneling gate oxide.

3. The sense amplifying magnetic tunnel device of claim 1, wherein the SAMT device is operable such that a current flow through the SVM cell develops a gate electrode control potential.

4. The sense amplifying magnetic tunnel device of claim 1, wherein the SVM cell is coupled in series to the gate electrode.

5. The sense amplifying magnetic tunnel device of claim 1, wherein the SVM cell is coupled between a sense potential and the gate electrode.

6. The sense amplifying magnetic tunnel device of claim 1, wherein the SAMT device is operable such that the tunneling property of the tunneling gate oxide provides a gain in a sense current applied through the SVM cell.

7. The sense amplifying magnetic tunnel device of claim 1, wherein the SAMT device is a sense amplifying data storage device.

8. The sense amplifying magnetic tunnel device of claim 1, wherein the SAMT device is a sense amplifying magnetic field sensor device.

9. The sense amplifying magnetic tunnel device of claim 1, wherein the SVM cell is a tunnel junction cell.

10. A sense amplifying magnetic tunnel (SAMT) device comprising:

a cross-point array of adjustable resistor devices, each resistor device paired with and electrically coupled to an isolator device, the electrical coupling serving to provide a gain to a current passed through the paired adjustable resistor and isolator;

wherein each of the isolator devices is a field effect transistor (FET), the FET having a drain, a source, a channel therebetween, a gate electrode and a tunneling gate oxide proximate to the channel, the adjustable resistor devices being spin valve memory (SVM) cells, each SVM cell electrically coupled to the gate electrode.

11. The sense amplifying magnetic tunnel device of claim 10, wherein the SVM cell is coupled in series to the gate electrode.

12. The sense amplifying magnetic tunnel device of claim 10, wherein the SVM cell is coupled between a sense potential and the gate electrode.

13. The sense amplifying magnetic tunnel device of claim 10, wherein the SAMT device is operable such that a current flow through the SVM cell provides an injected current into the channel through the tunneling gate oxide.

14. The sense amplifying magnetic tunnel device of claim 10, wherein the SAMT device is operable such that a current flow through the SVM cell develops a gate electrode control potential.

15. The sense amplifying magnetic tunnel device of claim 10, wherein the SAMT device is a sense amplifying data storage device.

16. The sense amplifying magnetic tunnel device of claim 10, wherein the SAMT device is a sense amplifying magnetic field sensor device.

17. A sense amplifying magnetic tunnel (SAMT) device comprising:

at least one field effect transistor (FET) having a drain, a source, a channel therebetween, a gate electrode and a tunneling gate oxide proximate to the channel; and at least one spin valve memory (SVM) cell electrically coupled to the gate electrode of an FET, the SVM cell having:

a first ferromagnetic layer;

an intermediate layer in contact with the first layer;

a second ferromagnetic layer in contact with the intermediate layer opposite from the first ferromagnetic layer.

18. The sense amplifying magnetic tunnel device of claim 17, wherein the SVM cell is coupled in series with the gate electrode.

19. The sense amplifying data storage device of claim 17, wherein the SVM cell is coupled between a sense potential and the gate electrode.

20. The sense amplifying magnetic tunnel device of claim 17, wherein the intermediate layer and the tunneling gate oxide are comprised of substantially the same material.

21. The sense amplifying magnetic tunnel device of claim 17, wherein the intermediate layer is a tunnel junction.

22. The sense amplifying magnetic tunnel device of claim 21, wherein the tunneling properties junction properties of the tunneling gate oxide are substantially similar to the tunnel junction properties of the intermediate layer.

23. The sense amplifying magnetic tunnel device of claim 17, wherein the SAMT device is operable such that a sense current flowing through the SVM cell when a voltage is applied to the SVM cell develops a gate electrode control potential.

24. The sense amplifying magnetic tunnel device of claim 17, wherein the SAMT device is operable such that a sense current flowing through the SVM cell when a voltage is applied to the SVM cell provides an injected current into the channel through the tunneling gate oxide.

25. The sense amplifying magnetic tunnel device of claim 17, wherein the SAMT device is operable such that the tunneling property of the tunneling gate oxide provides a gain in a sense current applied through the SVM cell.

26. The sense amplifying magnetic tunnel device of claim 17, wherein the SAMT device is a two terminal device.

27. The sense amplifying magnetic tunnel device of claim 17, further including:

a first electrical conductor coupled to the SVM cell;

a second electrical conductor coupled to the source; and a third electrical conductor coupled to the drain;

wherein the first and third electrical conductors are electrically coupled.

28. The sense amplifying magnetic tunnel device of claim 17, wherein the SAMT device is a sense amplifying data storage device.

29. The sense amplifying magnetic tunnel device of claim 17, wherein the SAMT device is a sense amplifying magnetic field sensor device.

30. The sense amplifying magnetic tunnel device of claim 17, wherein the first and second ferromagnetic layers each have a magnetic orientation, the SVM cell having an alterable resistance based upon the first layer magnetic orientation being substantially parallel or anti-parallel to the magnetic orientation of the second layer.

31. A computer system comprising:

a main board;

at least one central processing unit (CPU) coupled to the main board; and at least one memory store joined to the CPU by the main board, the memory store including;

a plurality of parallel electrically conductive rows; and a plurality of parallel electrically conductive columns crossing the conductive rows, each thereby forming plurality of intersections;

a plurality of sense amplifying magnetic tunnel (SAMT) devices in electrical contact with and located at an intersection between a conductive row and a conductive column, each SAMT device including:

a field effect transistor (FET) having a drain, a source, a channel therebetween, a gate electrode and a tunneling gate oxide proximate to the channel; and a spin valve memory (SVM) cell electrically coupled to the gate electrode of the FET, the SVM cell having:

a first ferromagnetic layer;

an intermediate junction layer in contact with the first layer;

a second ferromagnetic layer in contact with the intermediate layer opposite from the first ferromagnetic layer.

32. The computer system of claim 31, wherein the SAMT device is operable such that a sense current flowing through the SVM cell when a voltage is applied to the SVM cell develops a gate electrode control potential.

33. The computer system of claim 31, wherein the SAMT device is operable such that a sense current flowing through the SVM cell when a voltage is applied to the SVM cell provides an injected current into the channel through the tunneling gate oxide.

34. The computer system of claim 31, wherein the SAMT device is operable such that the tunneling property of the tunneling gate oxide provides a gain in a sense current applied through the SVM cell.

* * * * *